(12) United States Patent
Chevallier

(10) Patent No.: US 11,605,426 B2
(45) Date of Patent: Mar. 14, 2023

(54) RETENTION DRIFT CORRECTION IN NON-VOLATILE MEMORY ARRAYS

(71) Applicant: Applied Materials, Inc., Santa Clara, CA (US)

(72) Inventor: Christophe J. Chevallier, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/239,491

(22) Filed: Apr. 23, 2021

(65) Prior Publication Data
US 2022/0343975 A1    Oct. 27, 2022

(51) Int. Cl.
*G11C 11/00*    (2006.01)
*G11C 13/00*    (2006.01)
*H03M 1/14*    (2006.01)
*G06N 3/063*    (2023.01)

(52) U.S. Cl.
CPC ............ *G11C 13/004* (2013.01); *G06N 3/063* (2013.01); *G11C 13/0038* (2013.01); *G11C 13/0069* (2013.01); *H03M 1/142* (2013.01)

(58) Field of Classification Search
CPC . G11C 13/004; G11C 13/063; G11C 13/0038; G11C 13/0069
USPC ......................................................... 365/148
See application file for complete search history.

(56) References Cited

U.S. PATENT DOCUMENTS

| | | | | |
|---|---|---|---|---|
| 10,482,953 | B1 * | 11/2019 | Lin | G11C 11/221 |
| 11,354,562 | B2 * | 6/2022 | Tran | G06N 3/063 |
| 2009/0073760 | A1 * | 3/2009 | Betser | G11C 16/3418 |
| | | | | 365/185.18 |
| 2011/0182104 | A1 | 7/2011 | Kim et al. | |
| 2014/0192581 | A1 * | 7/2014 | Achter | G11C 7/14 |
| | | | | 365/191 |
| 2015/0213886 | A1 * | 7/2015 | Toda | G11C 13/025 |
| | | | | 365/148 |
| 2016/0035402 | A1 | 2/2016 | Antonyan | |
| 2016/0172026 | A1 | 6/2016 | Lee | |
| 2020/0201751 | A1 * | 6/2020 | Wei | G11C 7/1006 |
| 2020/0402549 | A1 | 12/2020 | Guo et al. | |
| 2020/0402601 | A1 * | 12/2020 | Linder | G11C 27/024 |
| 2021/0074347 | A1 | 3/2021 | Van Ostrand et al. | |

OTHER PUBLICATIONS

Application No. PCT/US2022/023493, International Search Report and the Written Opinion, dated Jul. 6, 2022, 10 pages.

\* cited by examiner

*Primary Examiner* — Vu A Le

(74) *Attorney, Agent, or Firm* — Kilpatrick Townsend & Stockton LLP

(57) ABSTRACT

Methods and architectures for refreshing memory elements in a memory array may initialize a reference array that stores each of the possible values stored in the memory element. The values in the memory array and the reference array will drift in parallel over time. To perform a refresh, the drifted values may be read from the reference array and mapped to the original values that were stored when the reference array was initialized. Next, each value may be read from the memory array and matched with a corresponding value from the reference array. The known original value stored in the reference array can then be used to refresh the corresponding memory element in the memory array.

20 Claims, 10 Drawing Sheets

RETENTION DRIFT CORRECTION IN NON-VOLATILE MEMORY ARRAYS

TECHNICAL FIELD

This disclosure generally describes memory cells in memory arrays. Specifically, this disclosure describes a reference array storing values corresponding to the different intermediate values that the memory array is configured to store that is used for the refresh operation.

BACKGROUND

A resistive random-access memory (ReRAM) is a type of nonvolatile random-access memory (RAM) that operates by changing resistance across a dielectric solid-state material. A ReRAM device is often arranged with a control transistor in a 1 transistor-1 resistor (1T1R) memory cell architecture. These memory cells may be used in many different applications, including traditional Von Neumann architectures. A Von Neumann architecture is a computer architecture that includes a processing unit with an arithmetic logic unit and processor registers, a control unit with an instruction register and a program counter, memories that store data and instructions, and/or input/output mechanisms. When a 1T1R memory cell is used in a computer architecture, a filament may be formed between a pair of metal electrodes that causes the memory element to conduct in a relatively high-current state to represent a logic 1 value. This filament may be formed by generating a positive voltage pulse across the drain and source of the transistor. To reset the memory element, a negative voltage pulse may be applied to dissipate the filament and represent a logic 0 value.

SUMMARY

In some embodiments, a method of refreshing memory elements in memory arrays may include causing a value to be read from a memory element in a memory array; determining a plurality of reference values from a reference array; identifying a reference value in the plurality of reference values that corresponds to the value read from the memory element; determining an original value that was stored in at least one reference element in the reference array from which the reference value was determined; and causing the original value to be written to the memory element in the memory array.

In some embodiments, a memory system may include a memory array that includes memory elements that are configured to store N different values. N may be an integer value greater or equal to 3. The memory system may also include a reference array comprising N sets of reference elements, where each of the N sets of reference elements may store one of the N different values. The memory system may further include a controller configured to read and write values for the memory array and the reference array, where the memory elements may be used as weights for a neural network.

In any embodiments, any and all of the following features may be implemented in any combination and without limitation. The memory element may include a resistive random access memory (ReRAM) element, and the memory array may represent weights for a neural network. The original value may have been stored in the memory element in the memory array at a time the original value was also stored in the at least one reference element. The original value originally stored in the memory element may drift over time to the value read from the memory element. Determining the plurality of reference values from the reference array may include causing sets of reference elements to be read from the reference array for each value that memory elements in the memory array are configured to store, and combining the sets of reference elements together to determine the reference values from the reference array. Combining the sets of reference elements together may include calculating an average value for each of the sets of reference elements. The method or controller operations may also include initializing the reference array by storing each value that the memory elements in the memory array are configured to store in corresponding sets of reference elements in the reference array. Causing the original value to be written to the memory element may include providing positive or negative voltage pulses to the memory element to increase or decrease the value stored in the memory element. The positive or negative voltage pulses may have varying widths or magnitudes. Each of the N sets of reference elements may include a single reference element. Each of the N sets of reference elements may include M reference elements, where M may be an integer value greater than or equal to 2, and each of the M reference elements may store a same value from the N different values. The controller may be configured to perform operations comprising including maintaining a data structure that maps the N different values originally stored in the N sets of reference elements to N values that are later read from the N sets of reference elements. The memory array and the reference array may be part of a same physical array of memory cells on a chip. The memory system may include an analog-to-digital converter (ADC) that receives values from the memory array and the reference array, where the ADC may operate with a higher precision when receiving values from the reference array than when receiving values from the memory array. The ADC may receive values from the memory array and from the reference array, where the ADC may operate with a first precision when receiving values from the reference array and the memory array when refreshing the memory elements, and the ADC may operate with a lower precision when receiving values from the memory array when not refreshing the memory elements. The ADC may operate with the lower precision when calculating neural network coefficients during a neural network operation. The controller may be configured to perform a refresh of the memory elements and the sets of reference elements at regular intervals. The controller may be configured to perform a refresh of the memory elements and the sets of reference elements at non-uniform intervals. The controller may cause reference cells in one of the N sets of reference elements to be read simultaneously and averaged.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1B:
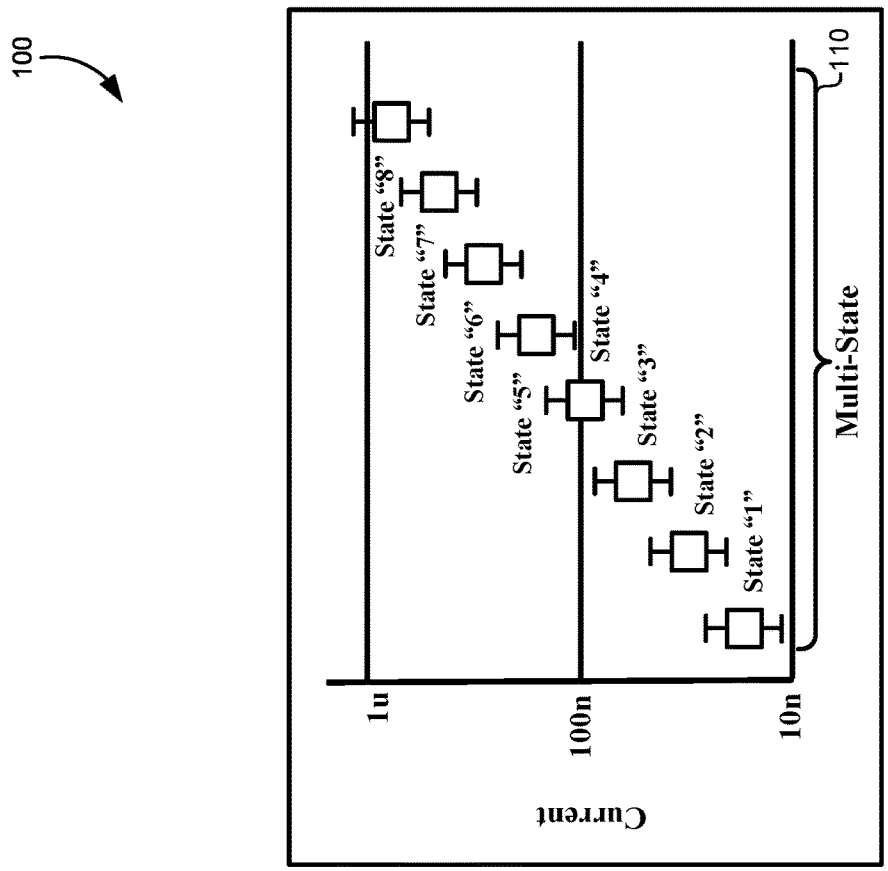
FIG. 1B illustrates a distribution of the plurality of intermediate states in the lower portion of the current range for the memory element, according to some embodiments.

Described herein are embodiments that correct for drift in nonvolatile memory arrays. Values stored in memory elements in memory arrays tend to drift over time. This may be due to degradation of memory cells, leakage currents, temperature variations, harsh environments, or the inevitable aging of the memory cells. Because drift is temperature dependent and most systems are not maintained in a controlled environment, is impossible to predict the amount of drift in each cell. This problem is complicated when using memory elements that can store a large number of analog values. In these cells, the drift is also dependent on the original value stored in the cell. Previous solutions have required a backup of the entire memory array in order to refresh the values after a significant drift has occurred.

The embodiments described herein solve these problems by providing a reference array that stores an original value for each of the analog levels that may be used by the memory elements in the memory array. For example, if memory elements are configured to store values between 1 and 64, 64 sets of reference elements may be initialized in the reference array, each storing one of the values 1 through 64. These reference elements in the reference array will tend to drift the same as the memory elements in the memory array as they are exposed to common process variations and temperature fluctuations. After a time lapse, a current drifted reference value may be read from the reference elements and mapped back to the original value stored in the memory element. This reveals the amount of drift that has occurred in the memory element at each value level. This mapping can then be used to refresh the memory elements in the memory array by reading a current value, matching it with a closest reference value in the reference array, and mapping that value back to the original value stored in the reference array.

A resistive random-access memory (ReRAM) is a type of nonvolatile random-access memory (RAM) that operates by changing resistance across a dielectric solid-state material. A ReRAM device is often arranged with a control transistor in a 1 transistor-1 resistor (1T1R) memory cell architecture. These memory cells may be used in many different applications, including traditional Von Neumann architectures. A Von Neumann architecture is a computer architecture that includes a processing unit with an arithmetic logic unit and processor registers, a control unit with an instruction register and a program counter, memories that store data and instructions, and/or input/output mechanisms. When a 1T1R memory cell is used in a computer architecture, a filament may be formed between a pair of metal electrodes that causes the memory element to conduct in a relatively high-current state to represent a logic 1 value. This filament may be formed by generating a positive voltage pulse across the drain and source of the transistor. To reset the memory element, a negative voltage pulse may be applied to dissipate the filament and represent a logic 0 value.

For traditional memory applications, such as embedded memories, a standard NOR FLASH memory cell may be sufficient. Each NOR FLASH memory cell can be programmed to two distinct current states generally described as a high-current state and a low-current state. As used herein, the term "low-current state" may refer to a minimum current state to which a memory cell may be set. For example, a low-current state may conduct less than approximately 10 nA of current. Generally, a low-current state may represent a logic 0 (i.e., binary "0"). Similarly, the term "high-current state" may refer to a maximum current state to which a memory cell may be set. For example, a high-current state may conduct more than approximately 10 $\mu$A of current. A high-current state may represent a logic 1 (i.e., binary "1"). Existing NOR FLASH technology may operate efficiently when toggling between these two states to represent binary 0 and binary 1, operating on principles of threshold voltage modulation rather than current differences.

While binary memories having two states may be used for traditional Von Neumann architectures, some non-Von Neumann architectures and other applications may benefit from memory cells that can be programmed into a continuum of states between the high-current state and the low-current state. This allows a single memory cell to store a plurality of values in addition to an on/off or I/O value (i.e., three or more states). While some memory cells can be optimized through material and integration advancements to achieve this multi-state behavior, none of the existing memory cells are able to set a plurality of intermediate states in a current-efficient manner.

Figure 1A:
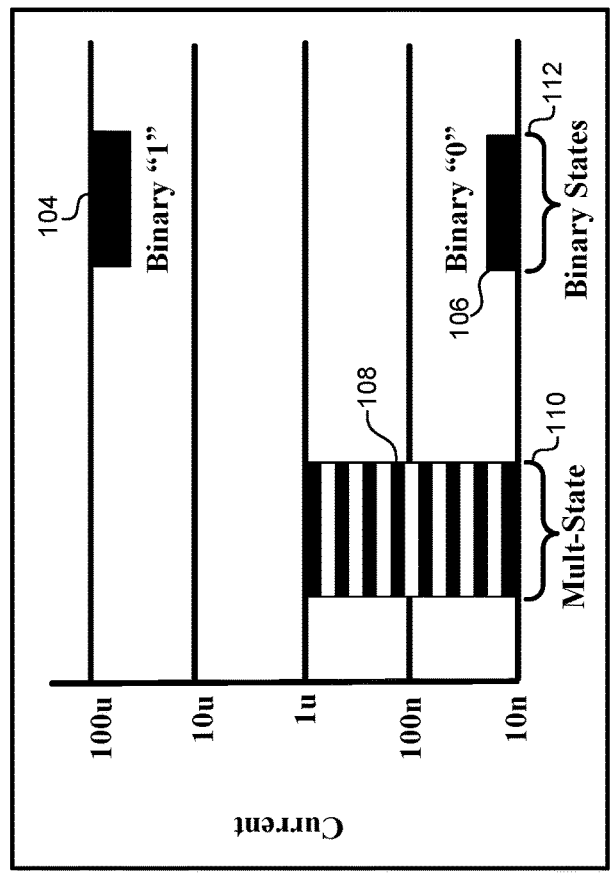
FIG. 1A illustrates a diagram of a current-efficient intermediate states in a memory element, according to some embodiments.

FIG. 1A illustrates a diagram of a current-efficient intermediate states in a memory element, according to some embodiments. The vertical axis illustrates normalized current through the memory element when in the corresponding state using a logarithmic scale. A single memory element may be set to use traditional binary states 112 comprising a high-current state 104 of greater than 10 $\mu$A (e.g., around approximately 100 $\mu$A representing) a logic 1. The memory element may also be set to a low-current state 106 representing a logic 0. Signals received by a memory cell to enter these states may be generally referred to as set/reset signals. A "set" signal may provide one or more voltage pulses to the memory cell that are sufficient to cause the memory element to enter the high-current state. For example, a set signal may provide a single pulse of sufficient magnitude or a plurality of pulses of a lesser magnitude that cause a filament to form in a ReRAM memory element to fully conduct current and represent a logic 1. Similarly, a "reset" signal may provide one or more voltage pulses to the memory cell that are sufficient to cause the memory element to enter the low-current state. For example, a reset signal may provide a single negative pulse of sufficient magnitude or a plurality of negative pulses of a lesser magnitude to cause a filament to be dissipated from a ReRAM device to prevent current conduction sufficient to enter the low-current state.

In addition to the traditional binary states 112, some embodiments may also allow a memory element to be set in a plurality of intermediate states 108 that are between the high-current state 104 and the low-current state 106. A multistate configuration 110 may receive one or more voltage pulses that cause the memory element to enter a current state that is between the high-current state 104 and the low-current state 106. Note that the plurality of intermediate states 108 need not be equally distributed throughout the entire current range of the memory element. Instead, the plurality of intermediate states 108 may be concentrated in the lower $\frac{1}{100}^{th}$ portion of the current range. This allows the memory element to operate in any of the plurality of intermediate states 108 without drawing a large amount of current. This may be of particular importance in arrays of memory elements, such as crossbar arrays and/or neural networks.

FIG. 1B illustrates a distribution of the plurality of intermediate states 108 in the lower portion of the current range for the memory element, according to some embodiments. In this example, there are eight intermediate states between the low-current state 106 and the high-current state 104. However, the current of the highest of the plurality of intermediate states 108 is less than approximately 1 μA. This is significantly less than the 100 μA that are conducted in the high-current state 104. Therefore, transitioning to even the highest of the plurality of intermediate states 108 can reduce the current usage by approximately 99%. The plurality of states 108 in FIG. 1B may overlap to some extent as allowed by the system controller operating on the chip, and may depend on the application.

In some embodiments, the memory element may include a metal top electrode and a metal bottom electrode. A voltage may be applied across the metal top electrode and the metal bottom electrode to cause a filament to form between the metal top electrode and the metal bottom electrode. For example, when a positive voltage is applied that is greater than a predetermined "set" voltage for the memory element (VSET), a filament may form to bridge an insulating memory layer to electrically connect the metal top electrode to the metal bottom electrode and form a conductive path.

Similarly, when a negative voltage is applied that is greater than a predetermined "reset" voltage for the memory element (VRST), the filament may be dissipated such that the conductive path is removed or greatly reduced between the metal top electrode and the metal bottom electrode. Note that when the reset signal is received, the width of the filament is largely unaffected. Instead, the portion of the filament between the remaining filament and the bottom metal electrode is dissipated, resulting in a tunneling barrier between the filament and the bottom metal electrode. Thus, current may still be conducted through the filament and the tunneling barrier, but the magnitude of this current will be greatly reduced, for example, to approximately 10 nA.

Some embodiments may use a partial "set" signal to write an intermediate value to the memory element. As used herein, a "partial set" signal may refer to one or more positive voltage pulses that are provided to the memory element that are not sufficient to fully enter the high-current state. A partial set signal may provide a series of voltage pulses such that each subsequent voltage pulse causes the filament in the memory element to progress in forming between the top/bottom metal electrodes. A partial set signal may refer to a single voltage pulse having a magnitude that is less than the set voltage and/or a plurality of voltage pulses of a lesser magnitude that are not sufficient to cause the filament to fully form.

For example, a first partial set signal may cause a filament to begin to form between the two electrodes. The filament may be very thin and may still leave a gap between the filament and the bottom electrode. This may correspond to an intermediate state that is slightly above 1 μA. A second partial set signal comprising additional positive voltage pulses may cause the filament to fully form between the electrodes and enter an intermediate state such that the memory element conducts approximately 10 μA. A third partial set signal may cause the formed filament to increase in width such that current flows through the filament with less resistance. This may correspond to an intermediate state such that the memory element conducts approximately 50 μA of current. Finally, a sufficient number of partial set signals may be received such that the filament is fully formed and the memory element can enter the high-current state of, for example, approximately 100 μA.

Figure 2:
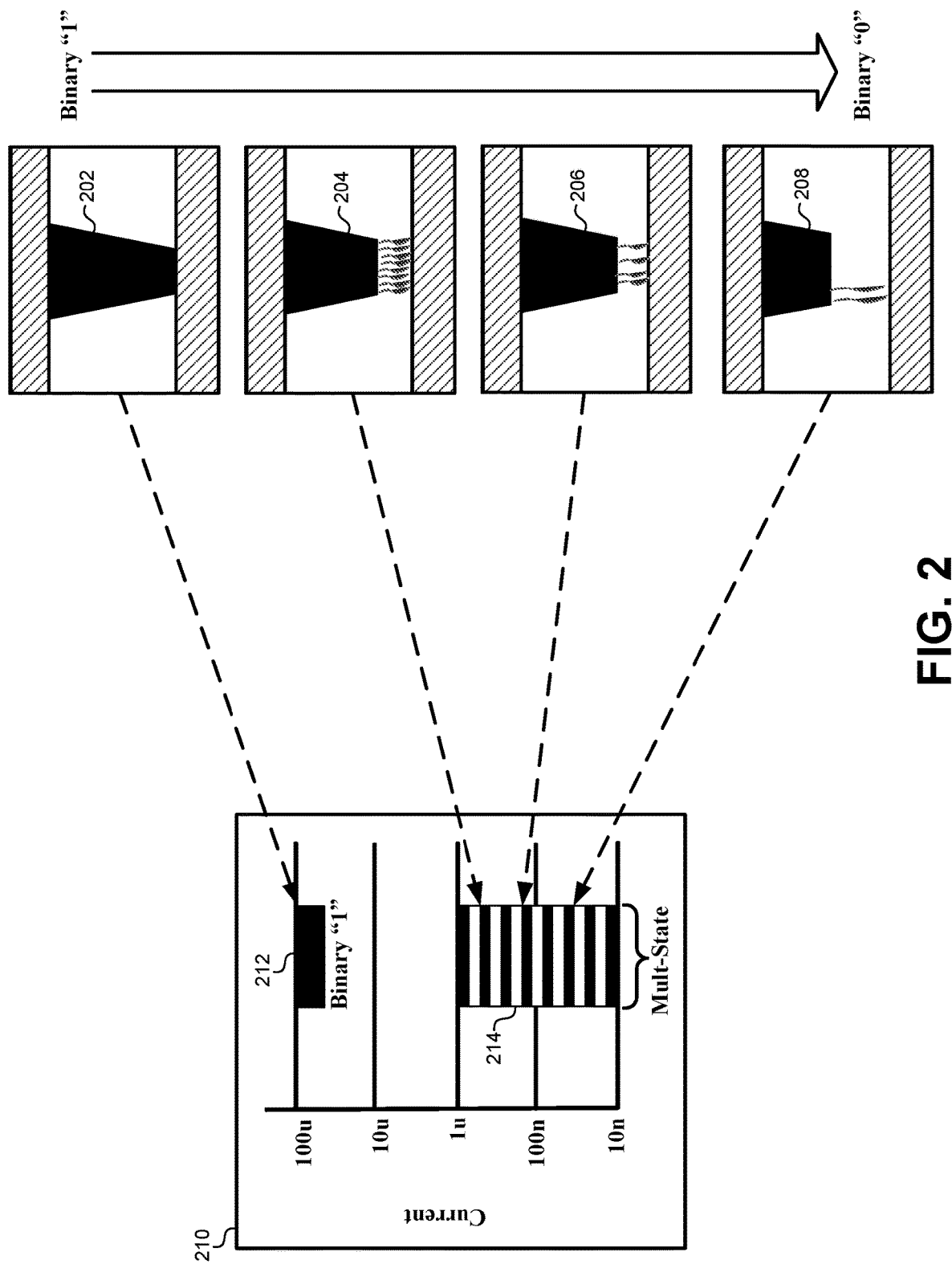
FIG. 2 illustrates how a plurality of intermediate states can be generated using a partial reset signal, according to some embodiments.

FIG. 2 illustrates how a plurality of intermediate states can be generated using a partial reset signal, according to some embodiments. As used herein, a "partial reset" signal may refer to one or more negative voltage pulses that are provided to the memory element that are not sufficient to fully enter the low-current state. A partial reset signal may provide a series of negative voltage pulses such that each subsequent voltage pulse causes the filament in the memory element to progressively dissipate between the metal top/bottom electrodes. A partial reset signal may refer to a single voltage pulse having a magnitude that is less than the reset voltage and/or a plurality of voltage pulses of a lesser magnitude that are not sufficient to cause the filament to fully dissipate.

In this example, the memory element may first be placed in the high-current state 212. This may be accomplished by providing a full set signal to the memory element. For example, one or more pulses of a sufficient magnitude or number may be provided to the memory element to fully form the filament 202 between the top/bottom metal electrodes. Using the high-current state 212 as a starting point, some embodiments may provide a partial reset signal to the memory element. For example, a plurality of negative voltage pulses may be successively applied to the memory element to cause the filament 202 to begin to dissipate at the bottom metal electrode.

A first intermediate state in a plurality of intermediate states 214 may correspond to a physical state where the filament 204 has dissipated away from the bottom metal electrode. It has been discovered that this greatly reduces the current of the memory element below that which can be obtained when the partial set signal was used to generate intermediate states. For example, the first intermediate state for filament 204 may have a current of less than 1 μA in the memory element. As successive partial reset signals (e.g., additional negative voltage pulses) are received by the memory element, lesser intermediate states may be entered as filament 206 progressively dissipates from the bottom metal electrode. For example, a second intermediate state corresponding to filament 206 may have a current of approximately 100 nA, and a third intermediate state corresponding to filament 208 may have a current of significantly less than 100 nA. Therefore, starting from a high-current state and gradually dissipating the filament using partial reset signals can generate a plurality of intermediate states that are very current-efficient for large arrays of memory elements. Progressively dissipating the filament, resulting in a progressively widening gap between the remaining filament and the bottom metal electrode results in different intermediate current states with low enough currents that they can be used in non-Von Neumann architectures. Additional details may be found in U.S. patent application Ser. No. 16/793,794, filed on Feb. 18, 2020, entitled "Soft Reset for Multi-Level Programming of Memory Cells in Non-Von Neumann Architectures," which is incorporated herein by reference.

Figure 3:
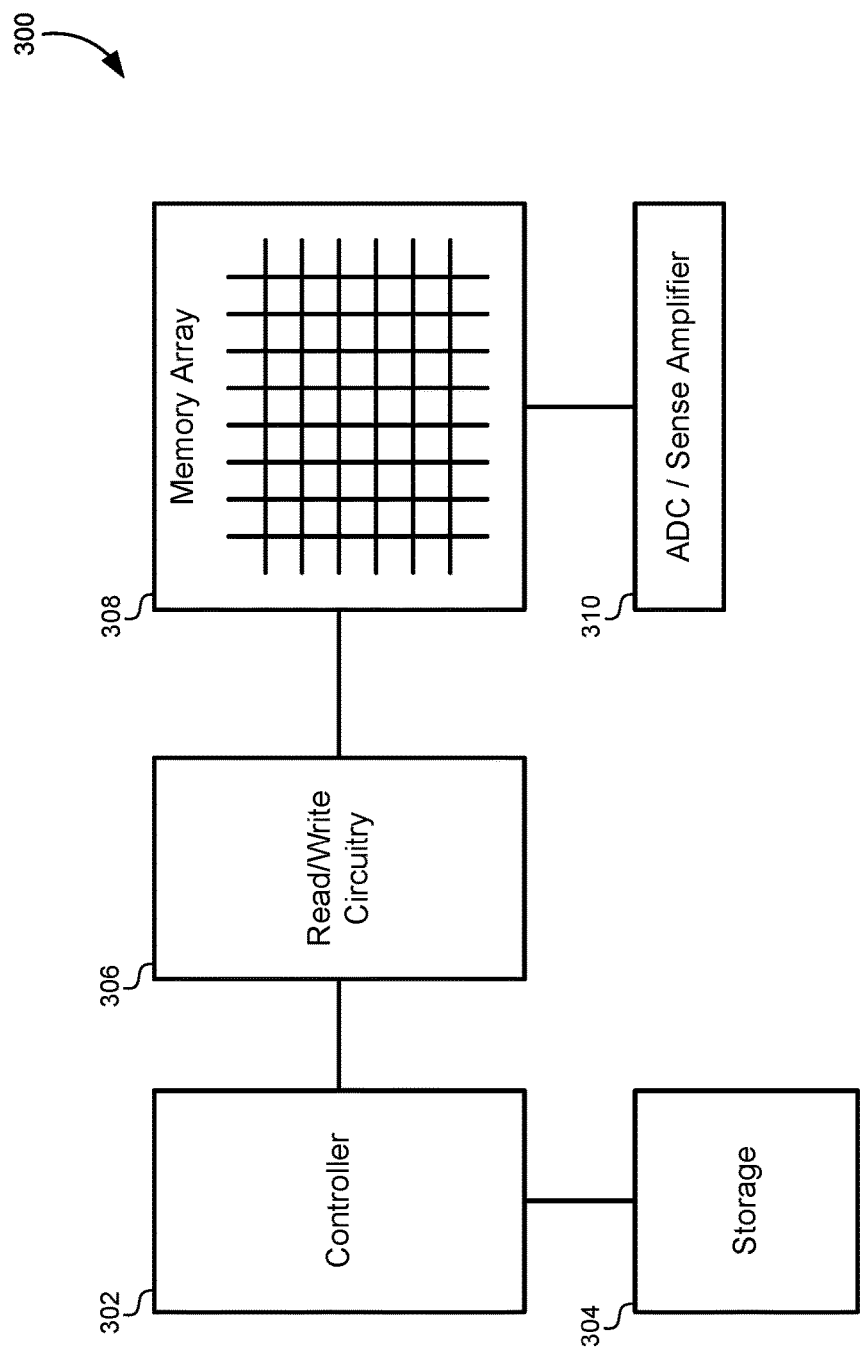
FIG. 3 illustrates a memory system that may be used in non-Von Neumann architectures, according to some embodiments.

FIG. 3 illustrates a memory system that may be used in non-Von Neumann architectures, according to some embodiments. By way of example, a non-Von Neumann architecture may include a neural network accelerator that processes tensors provided to a neural network in parallel across a plurality of different processing cores. Each stage of the neural network may include weights that are used to multiply intermediate values between stages of the neural network. When processing a large number of inputs or when using neural networks with a large number of internal hidden layers, the storage requirements for the weights may become very large. Thus, the performance of the neural network may hinge on the power consumption, speed, and/or reliability of a storage architecture used to maintain the weights. Note that although a neural network is used by way of example in this disclosure, it is not meant to be limiting. Many other types of non-Von Neumann architectures and/or traditional architectures may also be used with the embodiments described herein.

A memory system 300 may include a memory array 308. The memory array may include a plurality of individual memory elements. For example, the memory elements may be arranged in a crossbar array or other topology that allows memory elements to be read using X line and Y line addresses. The individual memory elements in the memory array 308 may include any type of memory element. By way of example, the ReRAM memory elements described above may be particularly well-suited for storing weights in a neural network. Specifically, the ReRAM memory elements may hold their values for a relatively long time interval while consuming very little power. Other types of non-volatile memories may be used, such as phase-change memories, and so forth.

The memory array 308 may provide an output to an analog-to-digital converter (ADC) 310 that is coupled to a sense amplifier. A sense amplifier is a well-known circuit used to read values from a memory array 308. The ADC 310 may convert the voltage and/or current signals provided from the memory array 308 into a digital value that may be read by a controller 302. The ADC 310 may be dynamically adjustable, such that the precision with which the ADC 310 operates may be changed based on the type of operation and/or location read from the memory array 308. An example of changing the precision of the ADC 310 is discussed in greater detail below.

The controller 302 may cause values to be written to the memory array 308 and/or read from the memory array 308. Read/write circuitry 306 may receive an address provided by the controller 302 and convert that address into digital signals that select a particular memory element or set of memory elements in the memory array 308. The controller 302 may then provide one or more values to be stored in the selected location in the memory array 308 through the read/write circuitry 306. The controller 302 may be configured to read/write one of a plurality of different value levels to a memory element. As described above, a memory element may be configured to store more than the traditional 0/1 memory states. For example, some memory elements may have a memory state space that is divided into 64 different discrete value levels, allowing a 6-bit number to be stored in a single memory element.

Although the ReRAM memory elements described above are particularly well-suited for long-term storage of values in the memory array 308, they are not immune from value drift over time. Specifically, as time passes, a value stored in a memory element in the memory array 308 may drift up or down. For example, in a 64-level memory element, an original value may be stored in a memory element having a level of "3." Over time, this value may drift up gradually to, for example, a "6" or higher. In other examples, the value may gradually drift down. The amount of drift and/or the direction of the drift may vary based on environmental conditions, temperature, and the original value itself, making this drift amount impossible to predict. Thus, the original values stored in the memory array 308 may no longer be derived from the memory array 308 alone after the values begin to drift.

In some cases, the values stored in the memory array 308 may be duplicated and stored in a persistent storage 304 as a backup. For example, these values may be stored on a disk or other long-term memory storage. In order to refresh the values in the memory array 308, the controller 302 may read the original values from the persistent storage 304 and write the original values back to the memory element in the memory array 308. However, this is not an optimal solution. First, it requires additional storage and memory interfaces to use the persistent storage 304. Second, the process of retrieving values from the storage 304 and writing them to the memory array 308 takes much longer than reading and writing values to/from the memory array 308 alone, as the read/write latency from the persistent storage 304 is generally much higher than that of the memory array 308. Third, this method of refreshing the values in the memory array 308 requires the storage of the memory array 308 to be completely duplicated in another storage medium. These technical problems slow down the operation of the architecture and require additional chip area or storage options to maintain the reliability of the memory array 308 over time.

The embodiments described herein solve these and other technical problems by providing a method and architecture for refreshing the memory array 308 to correct for value drift that does not require the duplicate memory of the persistent storage 304. Instead, these embodiments set aside a reference array that with one or more memory elements to store each of the different value levels in the memory array. As values in the memory array 308 drift over time, these values will also drift in a parallel fashion in the reference array. To refresh the memory array 308, the controller 302 may read in the drifted values from the reference array and map them to the original values for each value level. Drifted values from the memory array 308 may then be read and mapped to the original values based on the drifted values read from the reference array. The controller 302 may then provide positive/negative voltage pulses to correct each memory element back to its original value.

Figure 4:
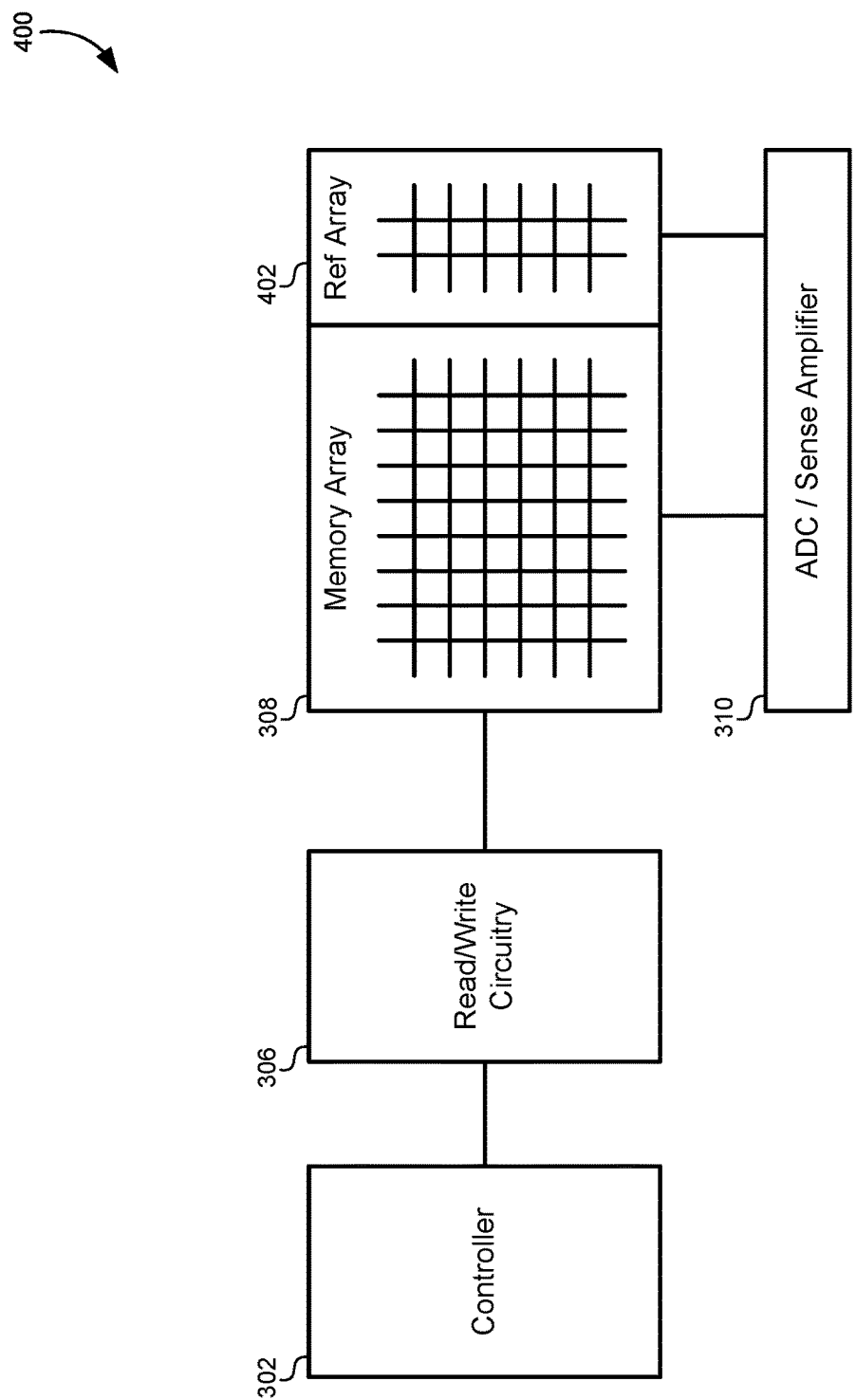
FIG. 4 illustrates a memory system that includes a reference array to correct for value drift over time, according to some embodiments.

FIG. 4 illustrates a memory system 400 that includes a reference array 402 to correct for value drift over time, according to some embodiments. The controller 302, read/write circuitry 306, memory array 308, and ADC 310 may function as described above in relation to FIG. 3. A reference array 402 may be included as part of the same physical memory layout as the memory array 308. For example, the reference array 402 may use the same read/write circuitry 306, the same address system, and/or the same read/write operations as the memory array 308. Alternatively, the reference array 402 may be implemented as an entirely separate memory array, using its own read/write circuitry and/or ADC. Regardless of the implementation, this disclosure will refer to the memory array 308 and the reference array 402 separately to distinguish the values stored in one array from values stored in the other. However, this nomenclature should be understood to be compatible with either implementation.

When the memory array 308 and the reference array 402 share the same ADC 310, the precision of the ADC 310 may be adjusted based on which of the two arrays 308, 402 is being read. For example, reading the reference array 402 may use a higher level of precision for the ADC 310 than is used when reading the memory array 308. In other embodiments, the precision for the ADC 310 may be higher when reading from the memory array 308 and the reference array 402 during refresh operation compared to a precision used by the ADC 310 when reading from the memory array 308 during normal operations.

When the reference array 402 is implemented as part of the memory array 308, the reference array 402 may be formed using the same fabrication processes to form the individual memory elements. Thus, the reference array 402 and the memory array 308 may share the same process characteristics that may affect value drift over time. Thus, value levels in the reference array 402 may be observed to drift at the same rate and in the same direction as corresponding value levels in the memory array 308. For example, a value level of "45" originally stored in the memory array 308 and the reference array 402 may drift in both arrays to a value of "43" after a defined time interval. Thus, the reference array 402 may be used to characterize the value drift that will be experienced in the memory array 308.

Figure 5:
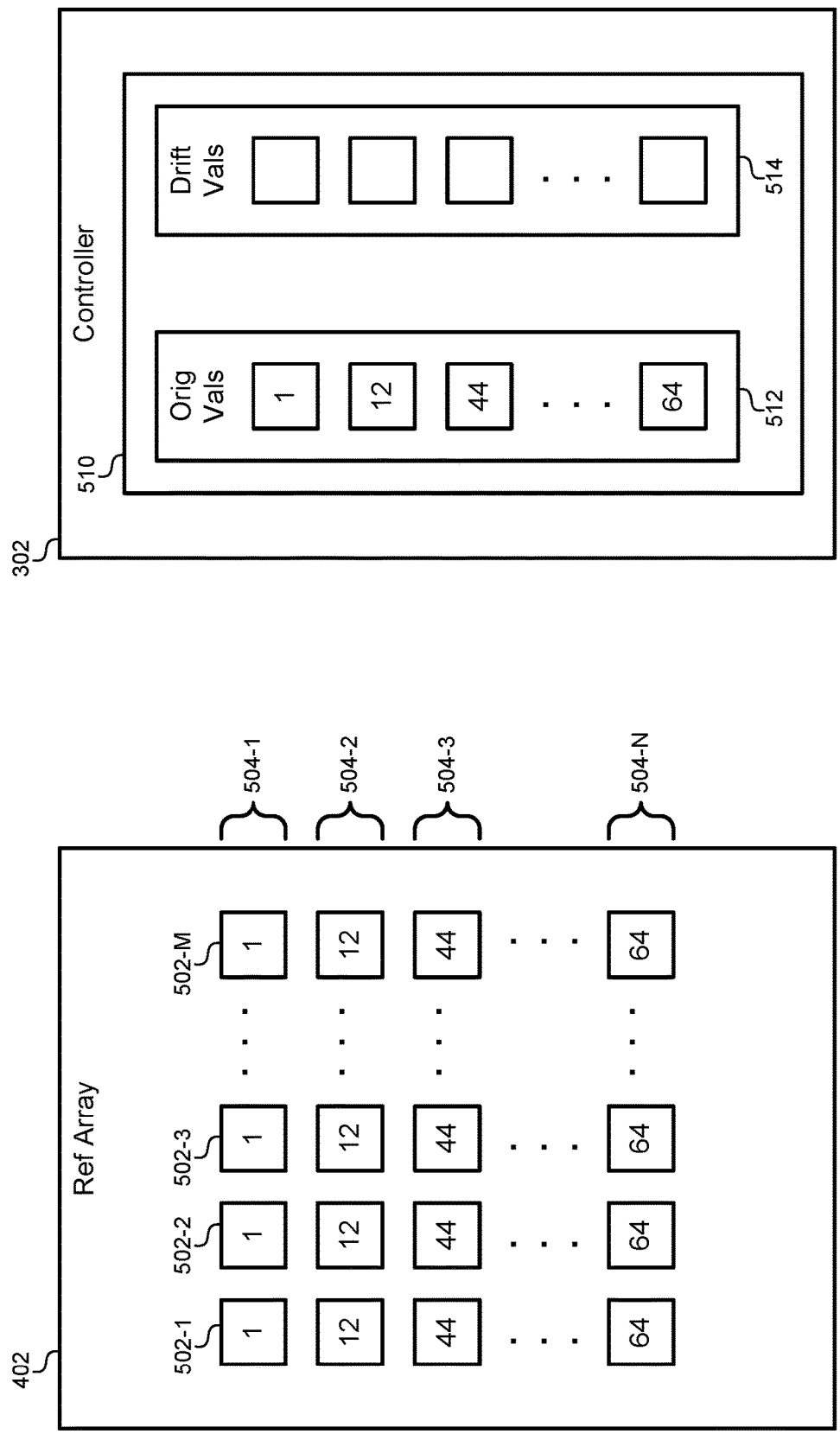
FIG. 5 illustrates how reference elements in the reference array may be initialized based on a number of values that may be stored in the memory array, according to some embodiments.

FIG. 5 illustrates how reference elements in the reference array may be initialized based on a number of values that may be stored in the memory array, according to some embodiments. As described above, each memory element in the memory array may be configured to store three or more values referred to as intermediate states. These different value levels may correspond to different resistances or current levels that may be measured when a voltage is applied across the memory element. For the sake of simplicity, these different value levels are referred to herein using integer values. For example, an integer value of "12" may correspond to a current through a memory element of approximately 20 nA.

The reference array 402 may include a plurality of reference elements. The reference elements may be memory elements that are the same as the memory elements used in the memory array, however the memory elements in the reference array 402 may be referred to herein as reference elements merely to distinguish them from the memory elements in the memory array, even though their operation and physical characteristics are the same.

The reference elements in the reference array 402 may be organized as sets of reference elements 504. The number of sets of reference elements 504 may correspond to the number of different value levels that may be stored in the memory element of the memory array. For example, if the memory elements are configured to store 64 different value levels (1, 2, 3, . . . 64), then the reference array 402 may be organized into 64 different sets of reference elements 504. More generally, if the memory elements are configured to store N different value levels (n=1, 2, 3, . . . N), then the reference array 402 may be organized into N different sets of reference elements 504.

Each of these sets of reference elements 504 may include at least one reference element. Specifically, some embodiments may use only a single reference element in each of the sets of reference elements 504. In other embodiments, each of the sets of reference elements 504 may include a plurality of reference elements 502. Each of the M reference elements in a single set of reference elements 504-1 may be initialized with the same original value corresponding to one of the value levels for the memory elements in the memory array. Using M reference elements 502 in each set of reference elements 504 provides redundancy, and these values can be combined to generate an average or other representative value for the drift as described below.

The example of FIG. 5 may correspond to a memory system where the memory elements can store, for example, 64 different value levels. Thus, the reference array 402 may include 64 different sets of reference elements 504. However, for the sake of clarity, the reference array 402 in FIG. 5 only illustrates four of the 64 sets of reference elements 504. In an actual implementation, the 64 sets of reference elements 504 would store value levels n=1, 2, 3, . . . N. By way of example, FIG. 5 shows a first set of reference elements 504-1 that stores a value level of "1." The reference array 402 then skips down to a value level of "12" for the second set of reference elements 504-2, and so forth. In one embodiment, N=64, and the 64 levels from 1 to 64 would be stored in reference array 402.

In some embodiments, the controller 302 may further maintain a data structure 510 that maps the original values stored in the reference array 402 to a set of values that will be read from the reference array 402 after a drift has occurred. For example, the data structure 510 may include a lookup table, a database, an array, a hash table, or any other data structure that can be used to look up a current value when providing an original value as a key. The controller 302 may store the original values 512 in the data structure 510 to correspond to each of the sets of reference elements 504 in the reference array 402. As will be described below, the drift values 514 can be populated later when the memory array is read and/or refreshed. Note that the original values 512 may be stored in the reference array 402 and designated in the data structure 510 at the same time that the memory array is populated with values. This ensures that the memory array and the reference array 402 begin drifting at the same time.

Figure 6:
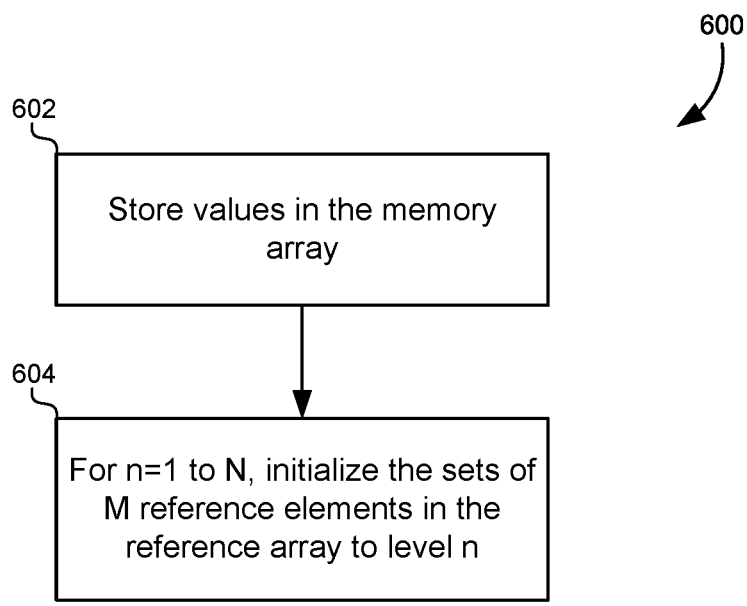
FIG. 6 illustrates a flowchart of a method for initializing a reference array, according to some embodiments.

FIG. 6 illustrates a flowchart 600 of a method for initializing a reference array, according to some embodiments. The method may be executed by the controller of the memory system. For example, the controller may cause the read/write circuitry to read/write values from/to the memory array. The method may include causing values to be stored in the memory array (602). These values may be stored in individual memory elements, such as ReRAM or other nonvolatile memory elements that are capable of representing three or more intermediate states. The memory array may be part of a neural network, and may represent weights that are applied to intermediate values that are propagated through the neural network. In some cases, the values may be stored in the memory array without requiring backup values to be stored in a separate persistent storage device. For example, some embodiments may store values in the memory array without storing any backup values in a disk, a flash memory, or any other persistent storage solution outside of the memory array itself. In practice, the memory array may store thousands of different values in different memory element locations.

The method may also include causing the reference array to be initialized using original values corresponding to each of the value levels available in the memory array (604). For example, the controller may execute an algorithm that loops through each value level available in the memory array. As described above, the reference array may be logically divided into sets of reference elements, each having an integer value M of reference elements. It should be emphasized that the reference array need not store values used in the evaluation of data in the neural network like the value stored in the memory array. Instead, the reference array stores multiple copies of the original or ideal levels that may be used to represent weights in the memory array. For example, the controller may cause each of the reference elements in set N=1 to store value level 1, each of the reference elements in set N=2 two value level 2, and so forth.

In some embodiments, the controller may also initialize a data structure that stores the original values that correspond to each of sets of reference elements in the reference array. As described above in FIG. 5, the data structure may include values that correspond to each of the sets of reference elements, and may store or otherwise indicate a corresponding original value level for each of those sets of reference elements.

Figure 7:
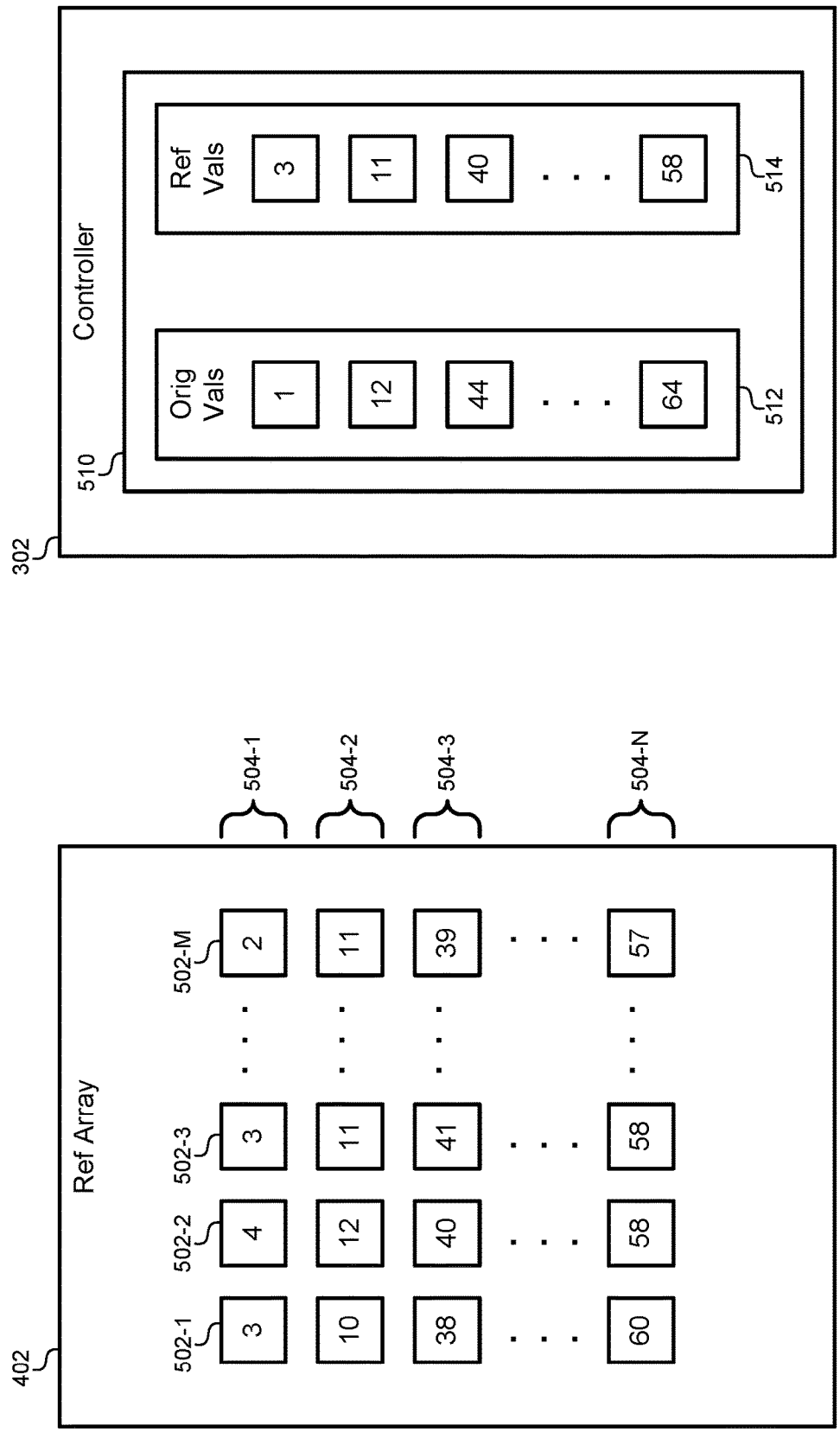
FIG. 7 illustrates how a mapping may be generated between the original values and the drift values in the reference array, according to some embodiments.

FIG. 7 illustrates how a mapping may be generated between the original values and the drift values in the reference array, according to some embodiments. As described above, the values stored in the reference elements in the reference array and the memory elements stored in the memory array may begin to drift over time. For example, the filaments formed in the individual memory elements may grow or shrink depending on the temperature conditions and other physical parameters experienced by the memory/ reference elements. The controller 302 may populate the data structure 510 to generate a mapping between these drift values and the original values that may be used when reading and/or refreshing values in the memory array.

As illustrated in FIG. 7, the reference elements 502 in each of these sets of reference elements 504 have drifted from the original values over time. For example, the reference elements 502 in the first set of reference elements 504-1 were all originally programmed to have a value level of "1", as shown in FIG. 5 However, these values have drifted over time (e.g., 3, 4, 3, 2, etc.). For example, the first entry in the original values 512 in the data structure 510 may record the original value (e.g., 1) stored in each of the reference elements 502 of the first set of reference elements 504-1 of FIG. 5.

Determining original values that was stored in the sets of reference elements 504 may include combining the reference elements 502 in the sets of reference elements 504 to generate single representative reference values. Some embodiments may find an average or mean value by statistically combining the values in the M reference elements. Some embodiments may select a minimum or maximum value from the M reference elements 502. Some embodiments may select a mode or use any other statistical measure to determine a representative reference value. Determining the reference values may involve executing mathematical calculations that are carried out by the controller in digital logic circuits that implement mathematical functions. Some embodiments may also use analog circuits to sum the currents from the reference elements 502 and generate an average or combined value, in some cases using the ADC/ Sense Amp 310 from FIG. 4.

The controller 302 may store the reference values 514 in the data structure 510. The reference values 514 may be mapped to the original values 512 in the data structure 510. The data structure 510 may represent a way of tracking how memory elements degrade over time and how values stored in the memory elements drift. As described below, the data structure 510 may be used to compensate for drift in any of the memory elements in the memory array. This can be differentiated with traditional methods for refreshing a memory array. Instead of retrieving a value for a particular memory element from a backup persistent storage, the data structure 510 may be used to correct for drift in all memory elements that store one of the reference values 514 when the refresh takes place, or the nearest approximation to the reference values 514.

Figure 8:
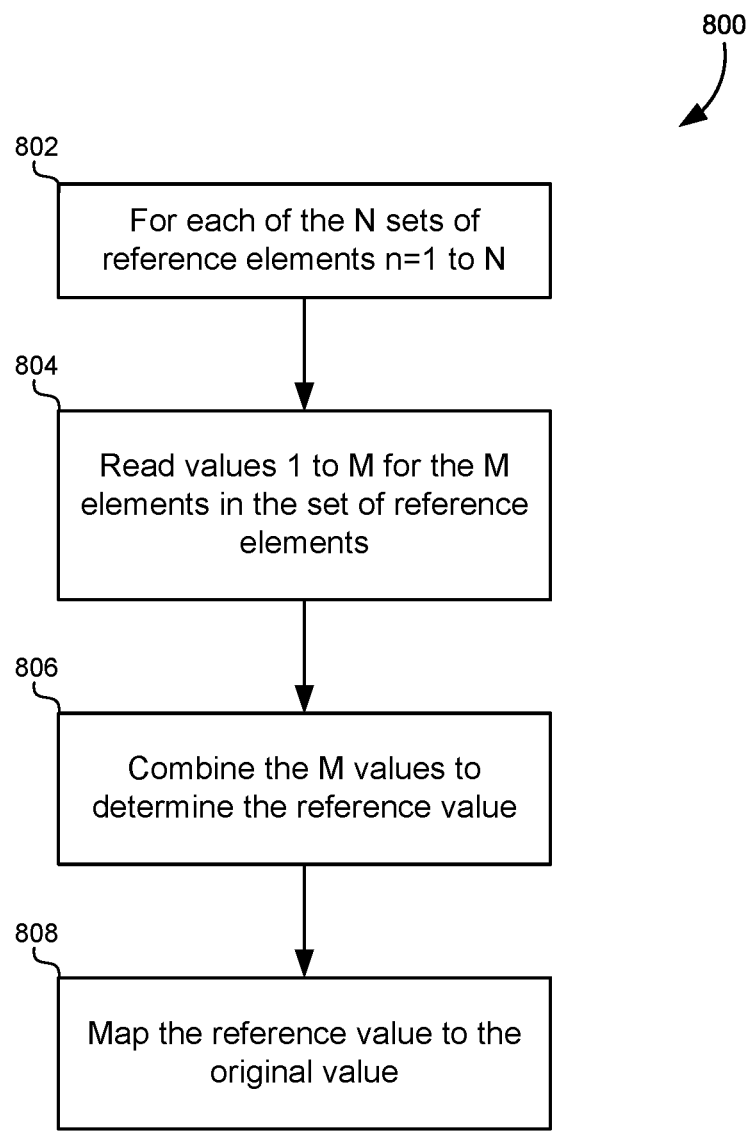
FIG. 8 illustrates a flowchart of a method for creating a mapping between reference values and original values in the memory array, according to some embodiments.

FIG. 8 illustrates a flowchart 800 of a method for creating a mapping between reference values and original values in the memory array, according to some embodiments. This method may be executed by the controller or by another computer system that reads and writes the memory array. The method may include a process that loops through each of the N sets of reference elements (n=1 to N) corresponding to the N different value levels that may be stored in memory elements in the memory array (802).

The method may also include reading values for the M reference elements in each set of reference elements (804). Some embodiments may include as few as a single reference element, while other embodiments may use 8 reference elements, 16 reference elements, and so forth. After reading M values from the reference elements for a set of reference elements, the M values can be combined to determine a reference value (806). As described above, this combination may use any statistical or mathematical method for combining values to determine a representative value, including average, median, mode, etc.

The method may further include mapping the reference value to the original value (808). As depicted above in FIG. 7, the reference values may populate the data structure. The data structure may provide a mapping between the reference values and the corresponding original values. For example, a lookup table may include pairs of reference values and original values.

After populating the data structure, the memory system can use the mapping between the reference values and the original values to accurately read values from the memory array. The data structure may also be used to refresh these values after they are read from the memory array. Because it may be assumed that the values in the reference array drift in the same way that values in the memory array drift over time, values read from the memory array can be matched with reference values in the data structure. The mapping in the data structure can then be used to determine the original value for that memory element.

For example, turning back to FIG. 7, a memory element in the memory array may return a value of "11." Because the values in the memory array are known to drift over time, that value of "11" is no longer an accurate representation of the original value that was stored in that memory element. However, the value of "11" read from the memory element can be mapped to the reference value of "11" in the reference values 514 of the data structure 510. The mapping in the data structure 510 may then be used to determine that the original value stored in the memory element was likely "12." Therefore, the memory system may return the value of "12" instead of "11" for the read operation. Additionally, the memory system may write the value of "12" back to the memory element to refresh the memory element and compensate for the value drift.

Figure 9:
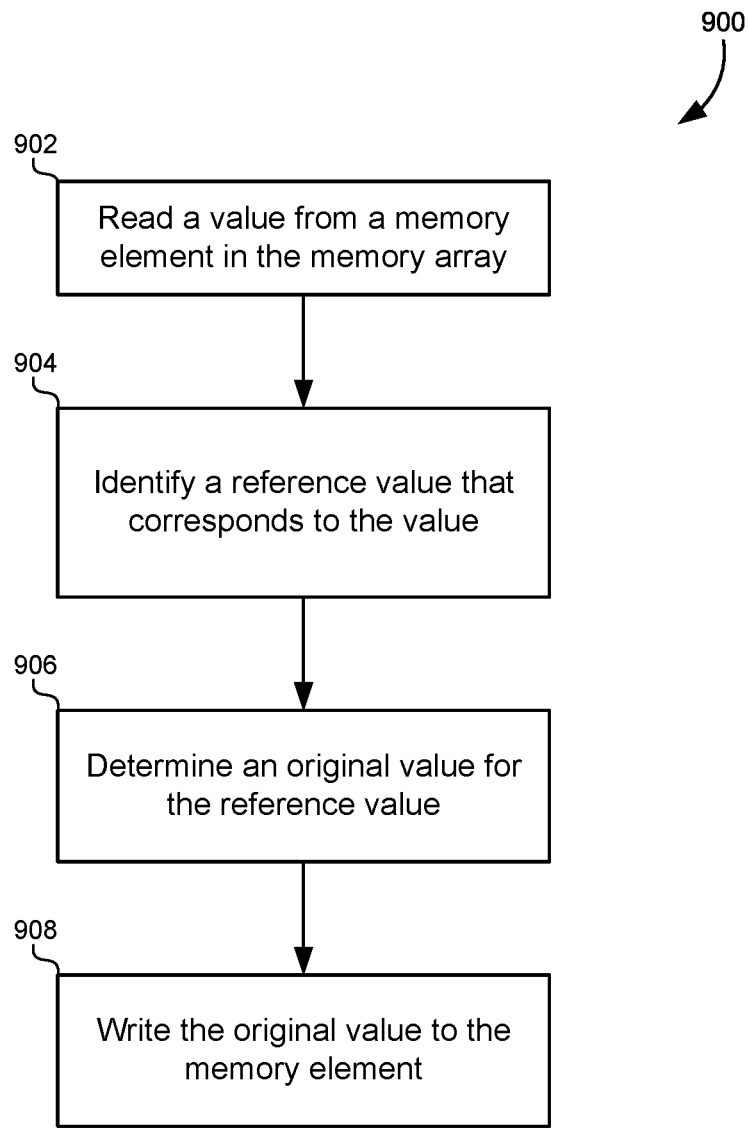
FIG. 9 illustrates a flowchart of a method for refreshing memory elements and memory arrays, according to some embodiments.

FIG. 9 illustrates a flowchart 900 of a method for refreshing memory elements and memory arrays, according to some embodiments. The method may include causing a value to be read from a memory element in a memory array (902). As described above, the memory array may include a number of nonvolatile memory elements, such as ReRAM memory elements. The memory array may be part of a neural network or any other array of memory elements. At a previous time (e.g., a first time) the memory element may have had an original value stored therein. The memory element may be configured to store one of a plurality of different values, such as 8 different values, 16 different values, 32 different values, 64 different values, and so forth, and other values that are not necessarily multiples of 2. Reading the value may take place at a later time (e.g., a second time) that may be hours, days, or weeks after the first time when the original value was stored in the memory element during which a drift may occur.

The method may also include determining a plurality of reference values from a reference array, and identifying a reference value in that plurality of reference values that corresponds to the value read from the memory element (904). As described above in relation to FIGS. 7-8, the reference values may be determined by reading and combining values from the reference array. The value read from the memory element may be used to identify a closest match for one of the reference values in the data structure. For example, if the value read from the memory element is between two reference values in the data structure, the method may identify the closest of the two reference values.

The method may also include determining an original value that was stored in at least one reference element in the reference array for which the reference value is determined (906). As described above in FIG. 5, the reference array may have originally had M copies of the original value stored in a corresponding set of reference elements. This original value may be determined based on the mapping in the data structure between the drift values and the original values recorded therein. Because the values in the memory element and the values in the reference elements tend to drift in the same fashion, the original value stored in the reference elements may be used as the original value stored in the memory element.

The method may further include causing the original value to be written to the memory element in the memory array (908). In addition to returning the original value from the memory system as a result of the read operation, the memory system may also refresh the value in the memory element. As described below, this can be accomplished by providing one or more positive/negative voltage pulses to the memory element to incrementally push the level stored in the memory element back to the original value. Note that this refresh operation may take place without requiring a corresponding read operation. Instead, the controller can populate the data structure with reference values and original values, then refresh every memory element in the memory array as part of a global refresh operation. Alternatively, this refresh operation to be done on demand as values are read from the array. This step will restore the values of the memory elements in the memory array and the reference elements in the reference array.

The refresh operation may be carried out at regular time intervals for the memory array. These time intervals may be evenly spaced. Alternatively, the refresh operation may be executed as needed. For example, the data structure mapping reference values to original values may be updated regularly and used to determine when a refresh operation should take place. For example, thresholds may be used such that when a number of reference values have drifted more than a threshold distance from their original values, a refresh operation is initiated.

Figure 10:
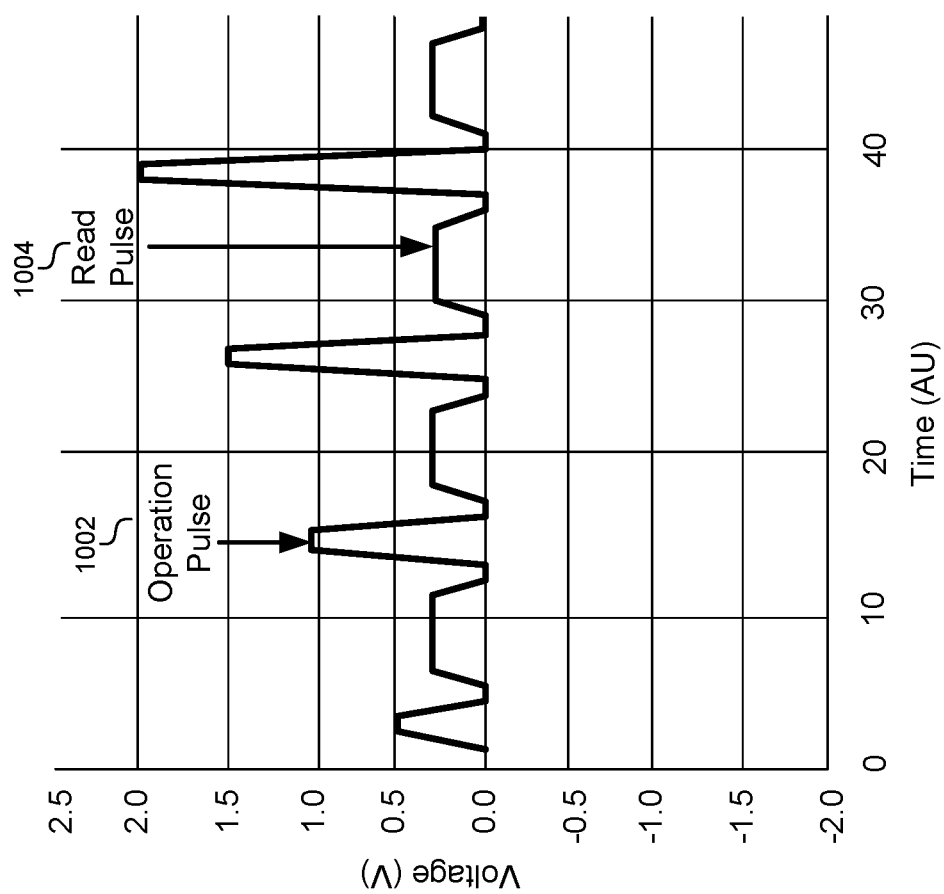
FIG. 10 illustrates a graph of how voltage pulses can be provided to a memory element to adjust the level stored in the memory element, according to some embodiments.

FIG. 10 illustrates a graph of how voltage pulses can be provided to a memory element to adjust the level stored in the memory element, according to some embodiments. In this embodiment, the set signal may include a plurality of voltage pulses. A first type of voltage pulse may be an operation pulse 1002 that is of a magnitude sufficient to increase the size of the filament formed in the memory element. In this example, each successive operation pulse 1002 may increase in magnitude until the level stored in the memory element is reached. Between each of the operation pulses 1002 one or more read pulses 1004 may be executed to measure an amount of current through the memory element. This may allow the memory element to incrementally move back up to the original level.

FIG. 10 illustrates positive voltage pulses that gradually increase in magnitude until the original value is reached in the memory element. Other embodiments may use repeated voltage pulses of the same magnitude, and instead increase the number of voltage pulses that may be used to move back to the original value in the memory element. Additionally, if a memory element drifts above the original value, negative voltage pulses may be used instead of the positive voltage pulses illustrated in FIG. 10. Some embodiments may also use voltage pulses of decreasing magnitude as the value in the memory element approaches the original value. The smaller voltage pulses may be used to "fine-tune" the value stored in the memory element.

It should be appreciated that the specific steps illustrated in FIGS. 6, 8, and 9 provide particular methods of using a reference array according to various embodiments. Other sequences of steps may also be performed according to alternative embodiments. For example, alternative embodiments may perform the steps outlined above in a different order. Moreover, the individual steps illustrated in FIGS. 6, 8, and 9 may include multiple sub-steps that may be performed in various sequences as appropriate to the individual step. Furthermore, additional steps may be added or removed depending on the particular applications. Many variations, modifications, and alternatives also fall within the scope of this disclosure.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, Flash Memories, magnetic or optical cards, flash memory, or other types of machine-readable mediums suitable for storing electronic instructions. Alternatively, the methods may be performed by a combination of hardware and software.

What is claimed is:

1. A method of refreshing memory elements in memory arrays, the method comprising:
    causing a value to be read from a memory element in a memory array;
    determining a plurality of reference values from a reference array;
    identifying a reference value in the plurality of reference values that corresponds to the value read from the memory element;
    determining an original value that was stored in at least one reference element in the reference array from which the reference value was determined; and
    causing the original value to be written to the memory element in the memory array.

2. The method of claim 1, wherein the memory element comprises a resistive random access memory (ReRAM) element, and the memory array comprises weights for a neural network.

3. The method of claim 1, wherein the original value was stored in the memory element in the memory array at a time the original value was also stored in the at least one reference element.

4. The method of claim 3, wherein the original value originally stored in the memory element drifts over time to the value read from the memory element.

5. The method of claim 1, wherein determining the plurality of reference values from the reference array comprises:
    causing sets of reference elements to be read from the reference array for each value that memory elements in the memory array are configured to store; and
    combining the sets of reference elements together to determine the reference values from the reference array.

6. The method of claim 5, wherein combining the sets of reference elements together comprises calculating an average value for each of the sets of reference elements.

7. The method of claim 5, further comprising initializing the reference array by storing each value that the memory elements in the memory array are configured to store in corresponding sets of reference elements in the reference array.

8. The method of claim 1, wherein causing the original value to be written to the memory element comprises providing positive or negative voltage pulses to the memory element to increase or decrease the value stored in the memory element.

9. The method of claim 8, wherein the positive or negative voltage pulses have varying widths or magnitudes.

10. A memory system comprising:
    a memory array comprising memory elements that are configured to store N different values, wherein N is an integer value greater or equal to 3;
    a reference array comprising N sets of reference elements, wherein each of the N sets of reference elements stores one of the N different values; and
    a controller configured to perform operations comprising:

reading and writing values for the memory array and the reference array, wherein the memory elements are used as weights for a neural network; and maintaining a data structure that maps the N different values originally stored in the N sets of reference elements to N values that are later read from the N sets of reference elements.

11. The memory system of claim 10, wherein each of the N sets of reference elements comprises a single reference element.

12. The memory system of claim 10, wherein each of the N sets of reference elements comprises M reference elements, wherein M is an integer value greater than or equal to 2, and each of the M reference elements store a same value from the N different values.

13. The memory system of claim 10, wherein the memory array and the reference array are part of a same physical array of memory cells on a chip.

14. The memory system of claim 10, further comprising an analog-to-digital converter (ADC) that receives values from the memory array and the reference array, wherein the ADC operates with a higher precision when receiving values from the reference array than when receiving values from the memory array.

15. The memory system of claim 10, further comprising an analog-to-digital converter (ADC) that receives values from the memory array and from the reference array, wherein the ADC operates with a first precision when receiving values from the reference array and the memory array when refreshing the memory elements, and the ADC operates with a lower precision when receiving values from the memory array when not refreshing the memory elements.

16. The memory system of claim 15, wherein the ADC operates with the lower precision when calculating neural network coefficients during a neural network operation.

17. The memory system of claim 10, wherein the controller is configured to perform a refresh of the memory elements and the N sets of reference elements at regular intervals.

18. The memory system of claim 10, wherein the controller is configured to perform a refresh of the memory elements and the N sets of reference elements at non-uniform intervals.

19. The memory system of claim 10, wherein the controller causes reference cells in one of the N sets of reference elements to be read simultaneously and averaged.

20. The memory system of claim 10, wherein the memory elements comprise resistive random access memory (ReRAM) elements.

* * * * *